United States Patent [19]

Padden

[11] Patent Number: 5,256,974
[45] Date of Patent: Oct. 26, 1993

[54] METHOD AND APPARATUS FOR A FLOATING REFERENCE ELECTRIC FIELD SENSOR

[75] Inventor: Robin R. Padden, Roy, Utah
[73] Assignee: Iomega Corporation, Roy, Utah
[21] Appl. No.: 724,544
[22] Filed: Jun. 27, 1991
[51] Int. Cl.⁵ .......................................... G01R 29/12
[52] U.S. Cl. .................................. 324/458; 324/457; 324/72
[58] Field of Search ............... 324/457, 458, 72, 72.5, 324/95

[56] References Cited

U.S. PATENT DOCUMENTS

| | | | |
|---|---|---|---|
| 3,426,280 | 2/1969 | Ruhnke | 324/72 |
| 3,611,127 | 10/1969 | Vosteen | 324/72 |
| 4,147,981 | 4/1979 | Williams | 324/458 |
| 5,128,622 | 7/1992 | Masada et al. | 324/458 X |

Primary Examiner—Kenneth A. Wieder
Assistant Examiner—Glenn W. Brown
Attorney, Agent, or Firm—Woodcock Washburn Kurtz Mackiewicz & Norris

[57] ABSTRACT

Method and apparatus for sensing electric fields with a dipole antenna, wherein the antenna generates an antenna signal representative of electric field potential, includes a signal generator for generating mixing signals having known characteristics, variable capacitors for generating first output signals representative of the antenna signal, wherein the capacitance of the variable capacitors is varied by the mixing signals such that the antenna signal is frequency translated. A signal processor processes the first output signals to generate a second output signal representative of the electric field. In a preferred embodiment of the invention, the mixing signals are a quadrature pair of sine waves. In an especially preferred embodiment, the variable capacitors are each a frame, a speaker mounted to the frame. The speaker cones move in response to a signal applied to each speaker. A first plate is attached to the cone and a second plate is attached to the frame, wherein movement of the cone moves the first plate relative to the second plate. In a still further embodiment, an isolation member is provided to generate a third output signal which is isolated from one half of the dipole, i.e., the floating antenna reference. In such embodiment the antenna effective length variation, due to different measurement devices adding varying conductor lengths to the ground reference, is minimized. It is preferred for the isolation member to be an optical isolator.

20 Claims, 5 Drawing Sheets

METHOD AND APPARATUS FOR A FLOATING REFERENCE ELECTRIC FIELD SENSOR

FIELD OF THE INVENTION

The present invention relates to the field of electric field sensing and, more particularly, to sensing electric fields in the low frequency range from zero to about 6 Hz and the mid frequency range up to about 100 kHz.

BACKGROUND OF THE INVENTION

It is desirable on occasion to measure low frequency electric fields. As used in this application, low frequency refers to the frequency range from 0 or DC to 6 Hz. Such frequency measurements can become significant in studies of atmospheric electricity or the study of electric fields in other gases or in a vacuum. Precise determination of such low frequency electric fields can also be significant in measuring the concentration or presence of air pollutants and other aerosols in the atmosphere. The measurement of low frequency electric fields associated with weather systems can have a significant impact on weather prediction. In the area of botanical research, the measurement of DC electric fields emanating from and/or influencing plant growth and development has been recognized. Finally, it may be desirable to measure geo-piezo-electric effects associated with, and possibly preceding, earthquakes.

Ruhnke U.S. Pat. No. 3,426,280 discloses an apparatus for measuring the potential gradient in the atmosphere. A dipole antenna was described as being used for this purpose.

While using a dipole antenna, the electric field sensor of the present invention measures the atmospheric potential gradient utilizing a novel variable capacitor and electrostatic barrier arrangement. The variable capacitor utilized in the present invention includes a speaker which has been modified to vary capacitance in relation to the signal being applied to the speaker coil. The use of speakers to provide a so-called capacitor detector has been shown in the past.

Vosteen U.S. Pat. No. 3,611,127 discloses an electrostatic meter which can operate either as an electrostatic field meter or volt meter and which includes a vibrating capacitor detector. In Vosteen the vibrating element of the capacitor detector includes a sandwich consisting of two conductors separated by a thin dielectic material. The sandwich is attached to the cone of a speaker and moved towards and away from a plate having a central opening. The amplitude by which the sandwich is moved towards and away from the opening is controlled such that the detector signals generated by the capacitor detector are modulated. In other words, in Vosteen, the electric field is sensed directly between the plate and the sandwich. In such a device the plate or casing of the device becomes the negative leg of a dipole antenna. Consequently, the vibrating member is vibrating in the electric field, such that the electric field measurement must be made at a fixed distance from the object under test. Still further, Vosteen connects the plate through a potentiometer and operational amplifier to ground, which also serves as the ground reference of the antenna, thereby adding effective length to the antenna.

In the present invention, the dipole antenna floats electrically and is isolated from the system ground via an electrostatic barrier. By floating the dipole antenna, each half samples average potential along its respective length, thus transducing a potential gradient into a terminal voltage without creating an inconsistently defined potential by grounding one half of the dipole to the same ground used by measuring apparatus. This means that electric field can be measured without the fixed distance from the object requirement.

SUMMARY OF THE INVENTION

The objects and advantages of the invention are achieved in a method and apparatus for sensing electric fields with a dipole antenna, wherein the antenna generates an antenna signal representative of electric field potential. The method and apparatus include a signal generator for generating mixing signals having known characteristics, variable capacitors for generating first output signals representative of the antenna signal, wherein the capacitance of the variable capacitors is varied by the mixing signals such that the antenna signal is frequency translated. A signal processor processes the first output signals to generate a second output signal representative of the electric field. In a preferred embodiment of the invention, the mg signals are a quadrature pair of sine waves. In an especially preferred embodiment, the variable capacitors are each a frame, a speaker mounted to the frame. The speaker cones move in response to a signal applied to each speaker. A first plate is attached to the cone and a second plate is attached to the frame, wherein movement of the cone moves the first plate relative to the second plate. In a still further embodiment, an isolation member is provided to generate a third output signal which is isolated from the antenna ground reference. In such embodiment the variation of effective length of the antenna is minimized. It is preferred for the isolation member to be an optical isolator.

BRIEF DESCRIPTION OF THE DRAWINGS

The present invention will be better understood and its numerous advantages will become apparent by references to the following detailed description of the invention when taken in conjunction with the following drawings in which.

DETAILED DESCRIPTION

Figure 1:
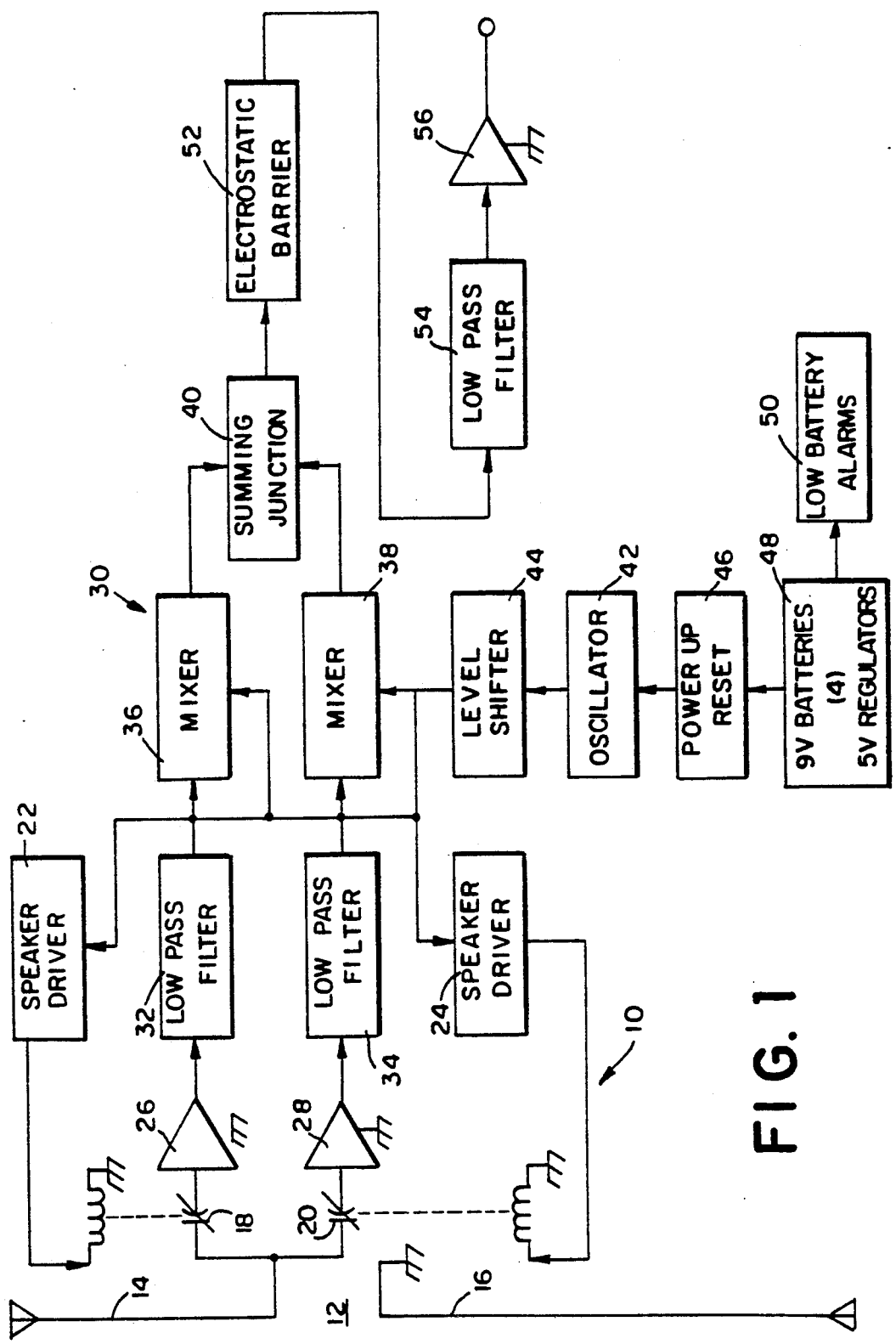
FIG. 1 is a block diagram of the preferred embodiment of the present invention.

A new and novel electric field sensor is depicted in FIG. 1 and generally designated 10. Sensor 10 is shown to include a dipole antenna 12, having first and second halves 14 and 16, respectively. Antenna half 16 is connected to a ground reference, such as a chassis ground, and antenna half 14 is connected to the inputs of variable capacitors 18 and 20. As will be described in greater detail in relation to FIG. 2, variable capacitors 18 and 20 include a pair of speakers in which capacitive elements are mounted. Signal generators 22 and 24, i.e., speaker drivers, generate mixing or driving signals having known characteristics. The particulars of such signals will be described hereinafter.

When a user of device 10 places antenna halves 14 and 16 in an electric field, each half of the dipole will be at a specific electrical potential. Such potential will be the mean value of the ambient spacial potential along the length of the antenna. A pair of high input impedance, low noise amplifiers 26 and 28, follow the antenna signal output by antenna half 14. Variable capacitors 1 and 20 that are posed between antenna half 14 and amplifiers 26 and 28 act to mix quadrature sine waves with the DC potential difference between the antenna halves. As will be explained in greater detail, the quadrature sine waves are output by speaker drivers 22 and 24 and served to drive the speaker coil component of variable capacitors 18 and 20. The result in mixing of the quadrature sine waves and the DC potential difference between the antenna halves frequency translates the DC potential away from DC. Such translation avoids difficulties in loading the antenna with a finite amplifier input impedance and reduces the effects of amplifier DC drift.

In other words, variable capacitors 18 and 20 are connected to receive the antenna signal and the speaker driver output signals. Capacitors 18 and 20 generate their own output signals which are representative of the antenna signal mixed with the speaker driver signal. The speaker driver signal serves to vary the capacitance of variable capacitors 18 and 20 during reception of the antenna signal from the antenna half 14, thereby frequency translating the antenna signal in relation to the speaker drive signals. The output of variable capacitors 18 and 20 is further processed by signal processing devices 30, which in turn generate an output signal representative of the electric field sensed by antenna 12.

Signal processing devices include amplifiers 26 and 28 whose outputs are connected to low pass filters 32 and 34. Filters 32 and 34 are utilized to remove any 60 Hz power line noise which may be present in the antenna signal and also serve to remove distortions introduced by variable capacitors 26 and 28. The output of filters 32 and 34 are provided to the input of mixers 36 and 38.

It will be recalled that the antenna signal generated by antenna half 14 was mixed with signals generated by speaker drivers 22 and 24. In the preferred embodiment, the driving or mixing signals are a quadrature pair of sine waves. At mixers 36 and 38, the mixed antenna signal and quadrature sine waves signal are again multiplied by clean cosine and sine waves having an amplitude of 1. The signals output from mixers 36 and 38 are summed in summing junction 40. In the preferred embodiment, summing junction 40 includes further low pass filters to help reduce higher harmonics. The output of summing junction 40 represents a scaled version of the electric field sensed by antenna 12. It will be noted that low pass filters 32 and 34 provide an equal gain to the antenna signals being processed by each filter.

It will also be noted at this point that oscillator 42 and level shifter 44 operate to generate an appropriate quadrature pair sine waves which are applied to speaker drivers 22 and 24 and mixers 36 and 38. Power up reset circuits 46, batteries and regulators 48 and low battery alarms 50 are also provided in the implementation of the preferred embodiment of the invention.

The antenna signal output by summing junction 40 is representative of a scaled value of the electric field sensed by antenna 12. The voltage of that output signal could be simply measured as is, were it not for the addition of effective antenna length contributed by the connecting the measurement systems to the same ground reference to which the antenna is attached. In other words, by simply measuring the voltage of the output signal of summing junction 40, the ground connection of the measuring system would result in effect antenna length being added to the length of antenna 12, thus distorting the voltage measurements. Such distortion would add an unknown scale factor as well as varying the sensitivity of the measuring system dependent upon the ground node size. The present invention circumvents the effect antenna length addition problem by use of an electrostatic barrier 52.

Electrostatic barrier 52, as will be described in greater detail in relation to FIG. 4, includes an opto-isolator. Electrostatic barrier 52 electrically isolates the signal processor 30 from the ground connection of the subsequent measuring system so that the effective antenna length of antenna 12 is maintained constant. The opto-isolator transfers the antenna signal to the isolated portion of electrostatic barrier 52. Low pass filter 54 serves to reduce any residual frequency "hash" which may have been added by mixers 36 and 38. Power driver amplifier 56 provides final amplification of the antenna signal prior to output to suitable recording and/or measurement instrumentation. Having now considered the present invention in general terms, consider more particularly some of the specific preferred structural and circuitry embodiments.

Figure 2:
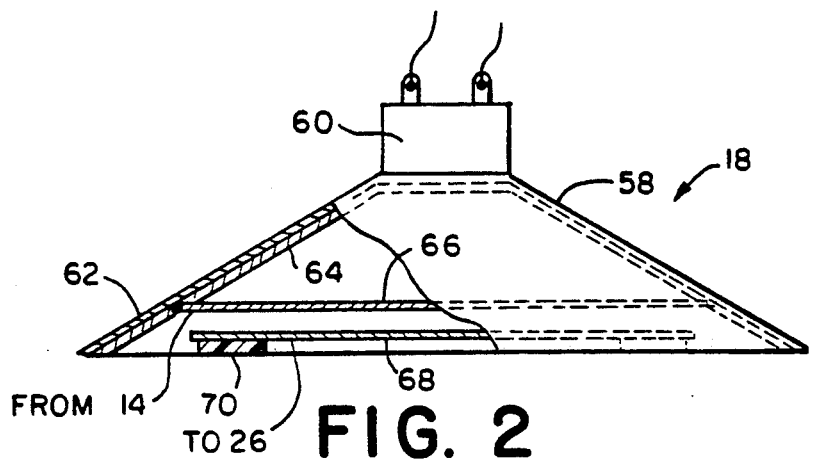
FIG. 2 is a side view of the variable capacitor utilized in the embodiment shown in FIG. 1.

Referring now to FIG. 2, the construction of variable capacitors 18 and 20 will be described in greater detail. It will be noted at the outset that since the construction of variable capacitors 18 and 20 is identical, only one is depicted. Variable capacitor 18 is shown to include a speaker 58 having a voice coil 60, a frame 62 and an interior cone 64. It will be understood that excitation of voice coil 60 causes movement of cone 64 relative to frame 62. A circular plate 66 is attached to cone 64 by adhesive or any other suitable means. A second plate 68 is connected via electrically insulating adhesive 70 to frame 62. Movement of cone 64 will result in the movement of plate 66 towards and away from plate 68. In other words, the distance between plates 66 and 68 will change depending upon the signal applied to voice coil 60. In the preferred embodiment, plate 66 and 68 are oriented to be generally parallel to each other and spaced approximately 7 mm apart with a preferred variation of plus or minus 0.7 mm. Plate 66 is connected to receive the signal generated by antenna half 14 and plate 68 is connected to the input of amplifier 26. In an alternative embodiment, speaker 58 is mounted in an inverted orientation on a printed circuit board, i.e., the speaker is mounted facedown. In such an alternative embodiment, plate 68 is attached directly to the printed circuit board.

It will be noted at this point that the utilization of quadrature variable capacitors in accordance with the present invention results in translation of the antenna generated frequency bands either up or down in frequency. Such translation is accomplished without folding frequency components as can be found in amplitude modulation techniques. A still further benefit of the use of the variable capacitor of the present invention is the static protection provided to the inputs of amplifiers 26 and 28 resulting from the air gap between plates 66 and 68. In the preferred embodiment, the 7 mm air gap will provide several thousand volts of input protection.

It will also be noted that in the preferred current flowing in it from the collector of PNP transistor 78. This DC current level shifts the emitter voltage of transistor 76 upwards enough to drive the base of transistor 84. The emitter of transistor 84 follows its base which in turn follows the emitter of transistor 76, which in turn follows the source of transistor 72. It will be recalled that the source of transistor 72 follows the gate of transistor 72. Thus, transistor 84 minimizes the voltage changes across the gate-to-drain capacitance of transistor 72 and reduces the current in that capacitance. Operational amplifier 80 makes up the gain stage of preamplifier 26. The DC output component of amplifier 80 is nulled to zero volts by the action of amplifier 86. In the preferred embodiment, amplifier 86 is an LP324 operational amplifier. Such DC is used to bias the gate of transistor 72.

It will be appreciated that diode 88, resistors 90 and 92 establish a voltage at 94 which drives mirror transistors 96, 97 and 98. Transistor 78 acts as a current mirror driven by transistor 96 and the combination of diode 100 and resistor 102. The frequency response of preamplifier 26 extends over 100 kHz.

Figure 4:
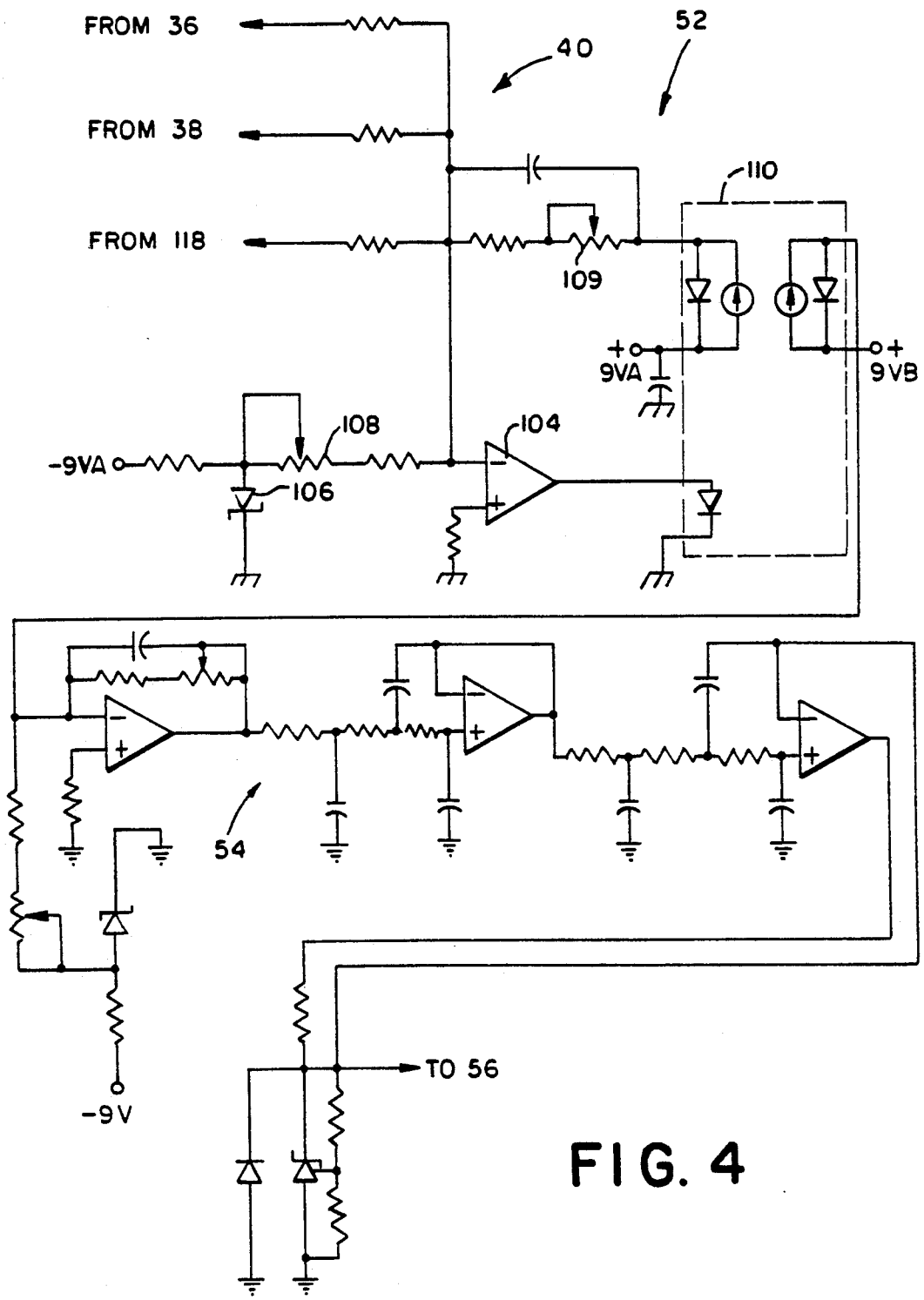
FIG. 4 is a schematic diagram of the summing junction electrostatic barrier and low pass filter shown, in FIG. 1.

Referring to FIG. 4, a more detailed depiction of summing junction 40 and electrostatic barrier 52 can be seen. The output of mixers 36 and 38 are summed in relation to the input of operational amplifier 104. In the preferred embodiment, operational amplifier 104 is an LP324. An offset adjustment is provided by diode 106, which in the preferred embodiment is an LM358AZ2.5. Variable resistor 108 acts as an offset adjustment mechanism. Variance resistor 109 acts as a gain adjustment mechanism. An optical isolator 110 receives the output of summing junction 40 as well as the output of operational amplifier 104. In the preferred embodiment, optical isolator 110 is an IL300 manufactured and sold by Seimens Corporation. Optical isolator 110 acts as an electrostatic barrier to isolate the ground reference of antenna 12 from the ground connection of subsequent monitoring equipment, thus limiting the effective size of the dipole embodiment plates 66 and 68 are preferably round. Optimum diameter will be determined by speaker diameter and plate spacing.

Figure 3:
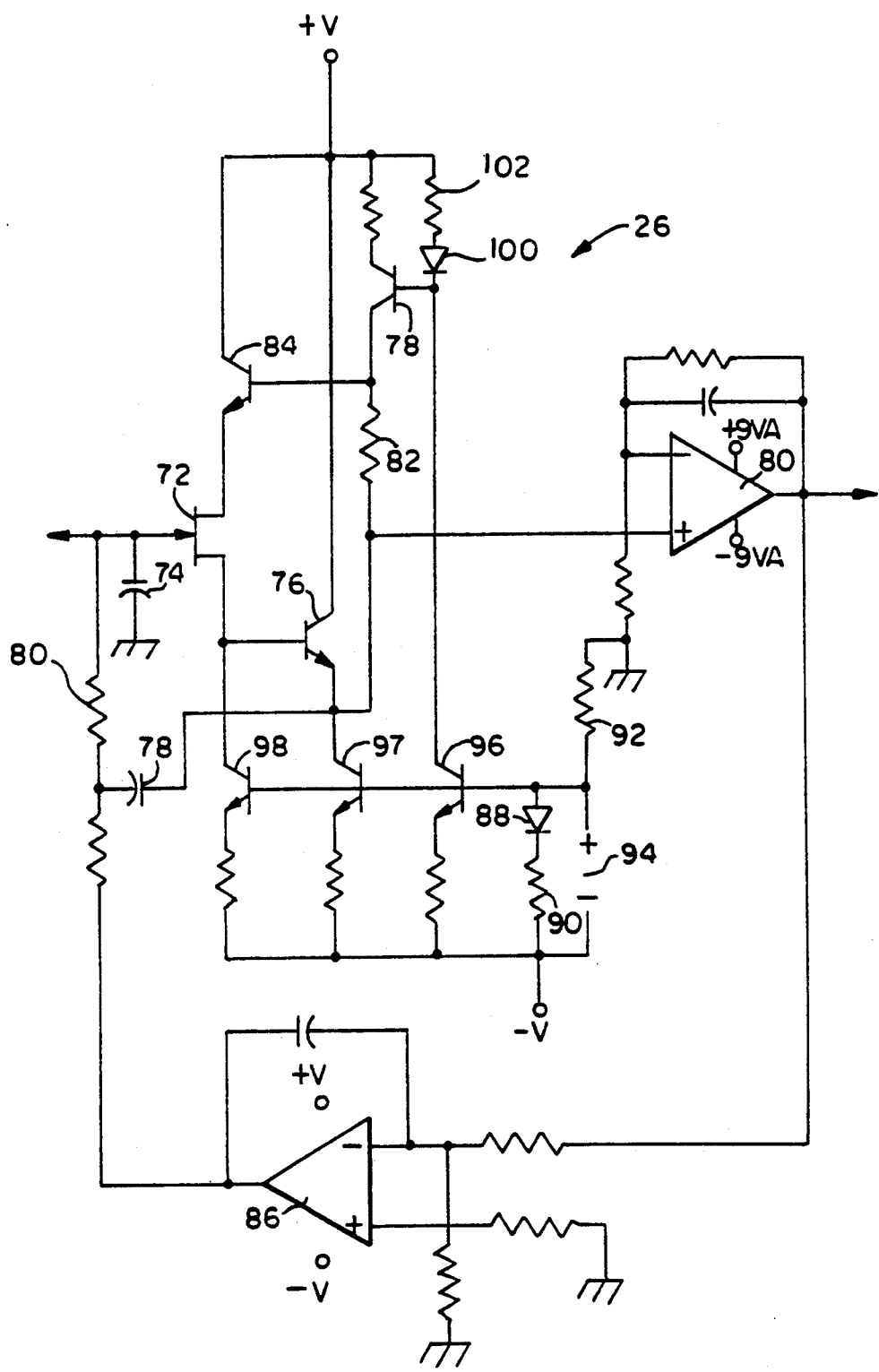
FIG. 3 is a schematic diagram of the pre-amplifier shown in FIG. 1.

Referring now to FIG. 3, preamplifier 26 will be described in greater detail. Preamplifier 26 provides a very high impedance low capacitance input to the output of variable capacitor 18. Again, preamplifiers 26 and 28 are identical. Consequently, only one preamplifier will be described in any great detail. The output of variable capacitor 18 is provided to the input of preamplifier 26 which is the gate of field effect transistor 72. It will be noted that a capacitor 74 is attached to the input of preamplifier 26. The use of capacitor 74 is optional. If used, capacitor 74 can have a value of approximately 150 picofareds, which serves to reduce the lower 3 dB corner frequency of the amplifier. It has been determined that use of such a capacitor reduces the lower bandwidth corner to approximately one cycle in two months, i.e., $0.193 \times 10^{-6}$ Hz. It will be noted that such a determination assumed that air and circuit resistances are more than 100 TERAOHMS.

The antenna signal is amplified by transistor 72 which has its gate-to-drain and gate-to-source capacitances reduced by boot strapping and 78 and finally amplified by operational amplifier 80. In the preferred embodiment, amplifier 80 is an LT 1008 amplifier.

In operation, a signal provided to the input of preamplifier 26 controls the source voltage of FET 72. In the preferred embodiment, FET 72 is low noise JFET with low Cgd and Cgs capacitances. Since the source voltage will follow the gate voltage, the source voltage will a purely DC-shifted version of the gate voltage. The source is buffered by transistor 76. The emitter of transistor 76 drives capacitor 78 which causes the voltage at resistor 80 to follow the gate voltage of transistor 72. Transistor 72 is thus provided bias current and the impedance value of resistor 80 is bootstrapped to a very high value. The output of transistor 76 also drives one terminal of resistor 82. Resistor 82 has a constant DC reference leg. The transferred signal is provided to low pass filter 54. The output of low pass filter 54 is provided to the input of power amplifier 56.

Figure 5:
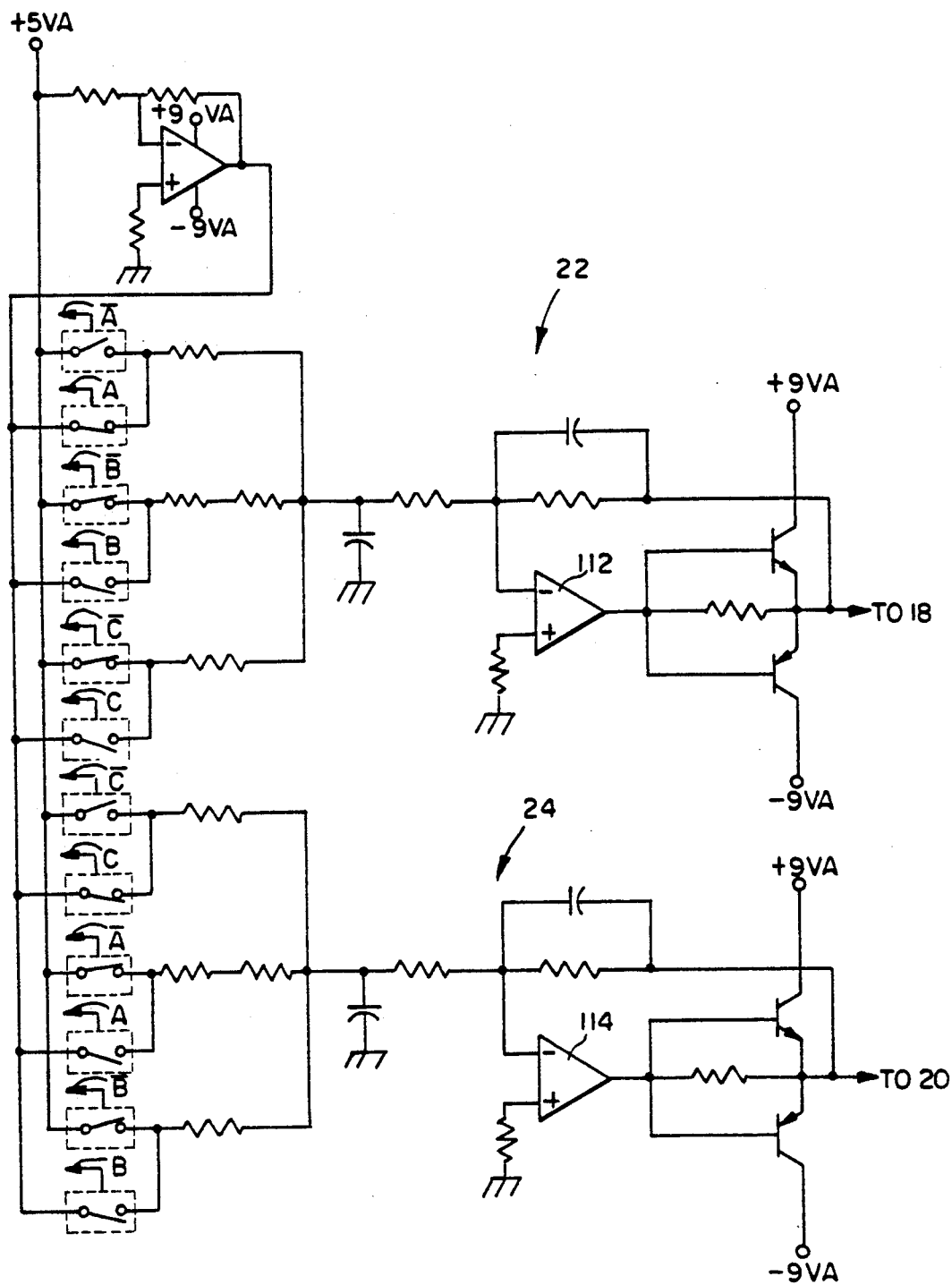
FIG. 5 is a schematic diagram of a the speaker drivers shown in FIG. 1.

FIG. 5 discloses a more detailed description of speaker drivers 22 and 24. It will be recalled that the outputs of speaker drivers 22 and 24 are a quadrature pair of sine waves. In the preferred embodiment, sensor 10 is operated by two 9 volt batteries (shown at 48 in FIG. 1). In order to generate quadrature sine waves from a 9 volt source, the present invention creates a pair of digital sine waves for each of the speaker drivers. Digital sine waves are created by first generating an oscillating signal in oscillator 42 which in the preferred embodiment includes a CD4047BC oscillator running at approximately 8 Hz. The output of oscillator 42 is divided down to 1 Hz by a CD4018 counter which is arranged as a "walking-ring" counter. It will be appreciated that the output of the CD4018BC in fact includes three 1 Hz signals. For the purposes of this application, these signals will be designated A, B and C.

Figure 6:
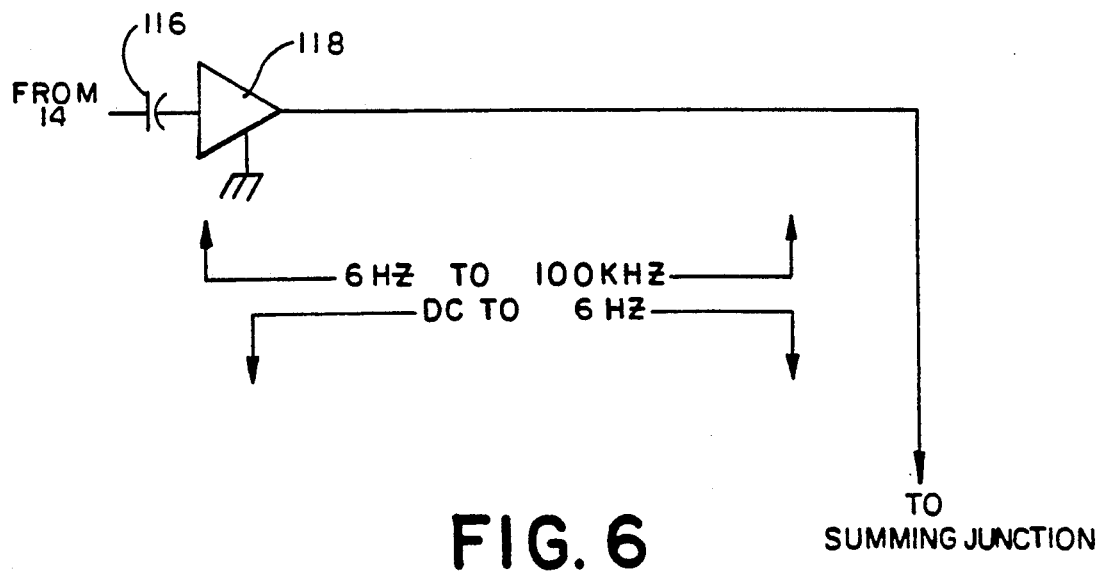
FIG. 6 is a schematic diagram of a modification to the embodiment in FIG. 1 which permits the sensing of higher frequency electric fields.

Signals A, B and C are provided to level shifter 44 (FIG. 1). Signals A, B and C are utilized to drive Schmidt triggers, which in the preferred embodiment are each a CD4093BC Schmidt trigger which are arranged as a simple invertor. The output of the CD4093BC drives an NPN transistor invertor, which in turn drives a saturated PNP switch. Signals A, B and C also drive NPN transistor invertors. The output of the NPN invertor driven by signal A shall be defined as "not A" or A inverted. The output of the PNP switch transistor will be designated A. Signals B and C are processed in relation to separate Schmidt triggers NPN invertors and PNP switches to generate B, "not B", C and "not C" signals. Such signals are provided to the switches shown in FIG. 5. In the preferred embodiment, the switches to which these signals are provided are CD4066 analog switches. The outputs of the switches are passed through various resistors which provide weighted sums which when added together in various combinations form a digital sine wave. By utilizing the combination of signals shown in FIG. 5, the signals output from drivers 22 and 24 will be 90° out of phase. The summed output of the analog switches are passed through low pass filters and provided to the input of operational amplifiers 112 and 114. The output of operational amplifiers 112 and 114 are buffered by PNP/NPN output buffers. As has been described up to this point, sensor 10 is ideally suited for sensing electric fields having frequencies in the range from 0 to 6 Hz. It may be desirable to sense electric fields having a higher frequency. In such situations, simple circuitry can be added to sense electric fields having frequencies from approximately 6 Hz to 100 kHz, which circuitry is shown in FIG. 6. As shown in FIG. 6, the variable capacitors have been replaced by a fixed capacitor 116, whose output is applied to a preamplifier 118. In the preferred embodiment, preamplifier 118 is identical to preamplifiers 26 and 28. The output of preamplifier 118 is provided to the summing junction shown in FIG. 4.

While the invention has been described and illustrated with references to specific embodiments, those skilled in the art will recognize that modification and variations may be made without departing from the principles of the invention as described herein above and set forth in the following claims.

What is claimed is:

1. Apparatus for sensing electric field gradients, said apparatus comprising:
    an antenna for measuring the potential between two points in an electric field to produce an antenna signal representative of a gradient of said electric field;
    signal generator means for generating mixing signals having known characteristics;
    variable capacitor means, connected to receive said antenna signal and said mixing signals, for generating first output signals representative of said antenna signal, wherein the capacitance of said variable capacitor means is varied by said mixing signals such that said antenna signal is frequency translated; and
    signal processing means, connected to receive said first output signals, for processing said first output signals to generate a second output signal representative of the electric field gradient sensed by said antenna.

2. The apparatus of claim 1, wherein said mixing signals comprise a quadrature pair of sine waves.

3. The apparatus of claim 2, wherein said first and second variable capacitors each comprise a frame, a speaker mounted to said frame, said speaker comprising a cone which moves in response to a signal applied to said speaker, a first plate attached to said cone and a second plate attached to said frame, wherein movement of said cone moves said first plate relative to said second plate.

4. The apparatus of claim 3, wherein said first and second plates are circular.

5. The apparatus of claim 3, wherein said first and second plates are attached to said cone and said frame so that said first and second plates are substantially parallel.

6. The apparatus of claim 5, wherein said first and second plates are spaced approximately 7 mm apart.

7. The apparatus of claim 1, wherein said variable capacitor means comprises first and second variable capacitors, wherein said mixing signals comprise quadrature pair signals wherein one of said quadrature pair signals is connected to said first variable capacitor and wherein another one of said quadrature pair signals is connected to said second variable capacitor.

8. The apparatus of claim 7, wherein said antenna signal is provided to said first plate and wherein said second output signal is generated from said second plate.

9. The apparatus of claim 1, wherein said antenna comprises first and second halves, wherein said first half generates said antenna signal and said second half is connected to a floating reference, said apparatus further comprising:
    isolation means, connected to receive said second output signal, for generating a third output signal, wherein said third output signal is isolated from said floating reference.

10. Apparatus for sensing electric field gradients, said apparatus comprising:
    an antenna for measuring the potential in an electric field to produce an antenna signal representative of a gradient of said electric field, wherein said antenna comprises a first and second halves, wherein said first half generates said antenna signal and said second half is connected to a ground reference;
    signal processing means for processing said antenna signal to generate an output signal representative of the electric field sensed by said antenna; and
    isolation means, connected to receive said antenna signal and connected to said signal processing means, for electrically isolating said signal processing means from said ground reference, whereby variation of effective antenna length is minimized.

11. The apparatus of claim 10, wherein said isolation means comprises an optical isolator.

12. A method for sensing electric field gradients, said method comprising the steps of:
    providing an antenna and measuring the potential between two points in an electric field to produce an antenna signal representative of a gradient of said electric field;
    generating mixing signals having known characteristics;
    providing variable capacitors, each connected to receive said antenna signal;
    generating first output signals, representative of said antenna signal, by varying the capacitance of said variable capacitors in response to said mixing signals such that said antenna signal is frequency translated; and
    processing said first output signals to generate a second output signal representative of the electric field gradient sensed by said antenna.

13. The method of claim 12, wherein said step of generating mixing signals comprise the step of generating a quadrature pair of sine waves.

14. The method of claim 12, wherein said step of providing variable capacitors comprises the steps of providing first and second speakers, mounting said first and second speakers to a frame, each of said first and second speakers comprising a cone which moves in response to a signal applied to said speaker, attaching a first plate to said cone and attaching a second plate to said frame, wherein movement of said cone moves said first plate relative to said second plate.

15. The method of claim 14, wherein said steps of attaching first and second plates comprises attaching said first and second plates so that said first and second plates are substantially parallel.

16. The method of claim 15, wherein said steps of attaching said first and second plates further comprises spacing said first and second plates approximately 7 mm apart.

17. The method of claim apparatus of claim 14, wherein said step of providing variable capacitors, each connected to receive said antenna signal, comprises the step of providing said antenna signal to said first plate and wherein said second output signal is generated from said second plate.

18. The method of claim 12, wherein said antenna comprises first and second halves, wherein said first half generates said antenna signal and said second half is connected to a floating ground reference, said method further comprising the step of isolating said second output signal from said ground reference by generating a third output signal isolated from said floating ground reference.

19. A method for sensing electric field gradients, said apparatus comprising:
   an antenna for measuring the potential in an electric field to produce an antenna signal representative of a gradient of said electric field, wherein said antenna comprises first and second halves, wherein said first half generates said antenna signal and said second half is connected to a ground reference;
   providing signal processing means for processing said antenna signal to generate an output signal representative of the electric field sensed by said antenna; and
   electrically isolating said signal processing means from said ground reference, whereby effective antenna length of said antenna is minimized.

20. The method of claim 19, wherein said step of electrically isolating said processing means comprises the step of optically isolating said processing means from said ground reference.

* * * * *